(12) United States Patent
Futatsuya

(10) Patent No.: US 7,047,516 B2
(45) Date of Patent: May 16, 2006

(54) PROXIMITY EFFECT CORRECTION APPARATUS, PROXIMITY EFFECT CORRECTION METHOD, STORAGE MEDIUM, AND COMPUTER PROGRAM PRODUCT

(75) Inventor: Hiroki Futatsuya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/379,535

(22) Filed: Mar. 6, 2003

(65) Prior Publication Data

US 2003/0170551 A1 Sep. 11, 2003

(30) Foreign Application Priority Data

Mar. 6, 2002 (JP) .............................. 2002-060775

(51) Int. Cl.
- *G06F 17/50* (2006.01)
- *G06F 1/00* (2006.01)
- *G03C 5/00* (2006.01)
- *G06K 9/00* (2006.01)

(52) U.S. Cl. ............................. 716/21; 716/19; 430/5; 430/30; 382/144

(58) Field of Classification Search ............ 716/19–21; 430/5, 30, 296, 311, 313; 428/325, 143; 382/144, 149; 356/394; 250/492.22, 208.1; 703/12; 700/97, 121

See application file for complete search history.

(56) References Cited

U.S. PATENT DOCUMENTS

| | | | |
|---|---|---|---|
| 5,807,649 A * | 9/1998 | Liebmann et al. | 430/5 |
| 6,168,891 B1 * | 1/2001 | Shibata | 430/30 |
| 6,249,597 B1 * | 6/2001 | Tsudaka | 382/144 |
| 6,335,981 B1 * | 1/2002 | Harazaki | 382/144 |
| 6,656,646 B1 * | 12/2003 | Hotta et al. | 430/5 |
| 2001/0005566 A1 * | 6/2001 | Kotani et al. | 430/5 |
| 2001/0053964 A1 * | 12/2001 | Kamon | 703/2 |
| 2003/0084420 A1 * | 5/2003 | Aton et al. | 716/19 |
| 2003/0140330 A1 * | 7/2003 | Tanaka et al. | 716/19 |

FOREIGN PATENT DOCUMENTS

JP   02000049072 A * 2/2000

* cited by examiner

Primary Examiner—A. M. Thompson
Assistant Examiner—Helen Rossoshek
(74) Attorney, Agent, or Firm—Westerman, Hattori, Daniels & Adrian, LLP.

(57) ABSTRACT

Light intensity values only of the vicinity of a specified portion, that is, for example, based on a prescribed value, an area where the distance between edges of an object to be corrected is equal to or shorter than the prescribed value are calculated, and the object to be corrected is corrected based on the light intensity values.

16 Claims, 7 Drawing Sheets

LIGHT INTENSITY NECESSARY POINT

OBJECT TO BE CORRECTED

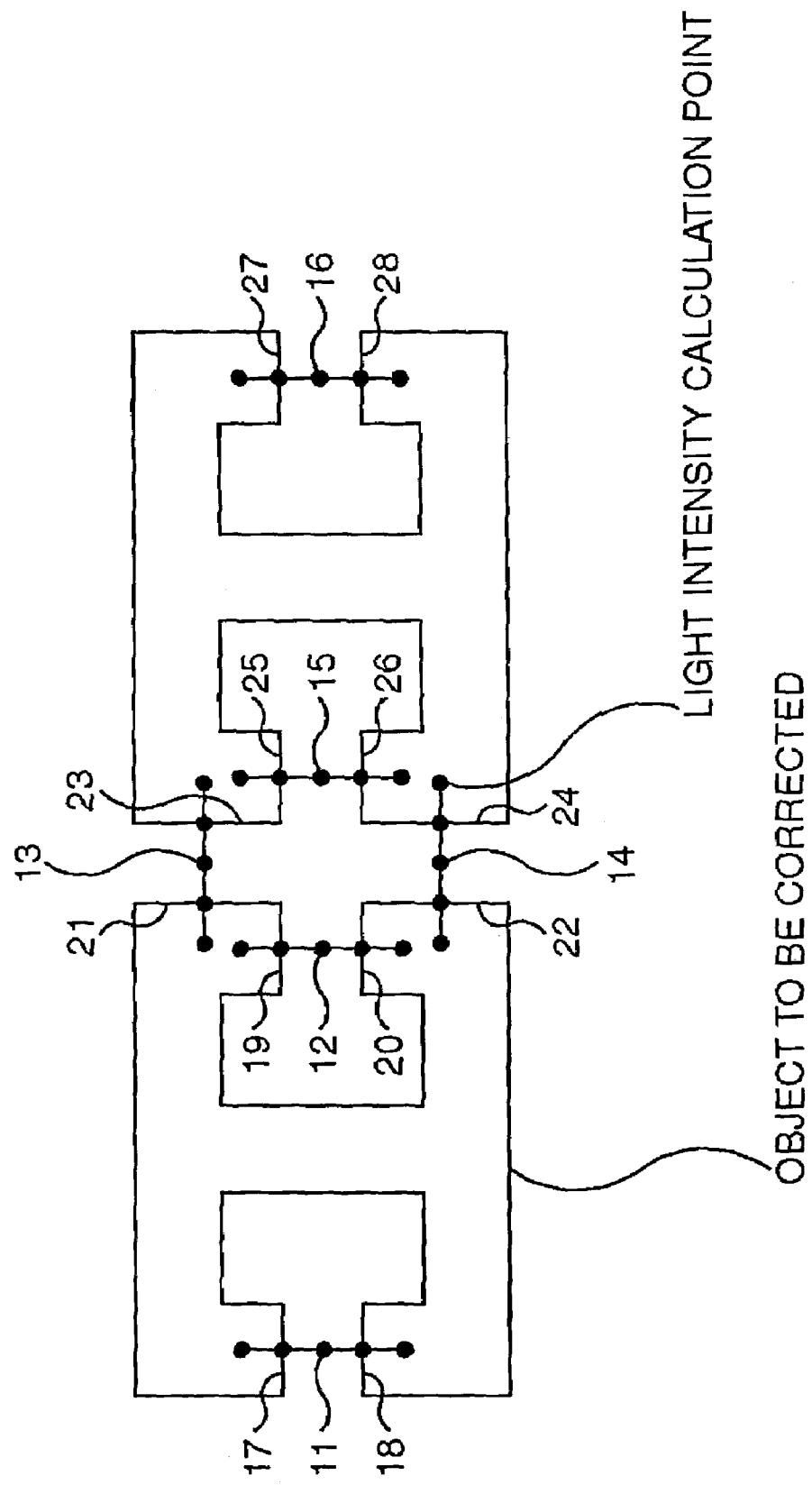

● LIGHT INTENSITY SAMPLING POINT

PROXIMITY EFFECT CORRECTION APPARATUS, PROXIMITY EFFECT CORRECTION METHOD, STORAGE MEDIUM, AND COMPUTER PROGRAM PRODUCT

CROSS-REFERENCE TO RELATED APPLICATIONS

This application is based upon and claims the benefit of priority from the prior Japanese Patent Application No. 2002-060775, filed on Mar. 6, 2002, the entire contents of which are incorporated herein by reference.

BACKGROUND OF THE INVENTION

1. Field of the Invention

The present invention relates to an apparatus, a method, a storage medium, and a computer program product for performing proximity effect correction in exposing a mask pattern by lithography.

2. Description of the Related Art

A demand for a finer semiconductor circuit has been recently increasing and an influence of a proximity effect as a result of making the circuit finer is becoming a matter which is not negligible. This influence of the proximity effect has brought about a problem that a semiconductor circuit as designed cannot be manufactured. Accordingly, processing called proximity effect correction is performed in which the influence of the proximity effect is previously understood and design data is changed in advance so that a desired size can be obtained.

Conventional proximity effect correction processing has been performed by, in a side of an object to be corrected, calculating the distance to adjacent sides calculated in a perpendicular direction, a size of the object to which the side belongs, the distance to a side further beyond the object, and the like, and defining a proximity effect correction rule adaptable to these values.

However, the definition of the correction rule is limited and a complicated form and the like are difficult to be represented by the rule. Therefore, the use of a simulator has been recently considered as a means for obtaining a sufficient correction effect even in a state in which a mask pattern is complicatedly arranged.

When proximity effect correction using the simulator is performed, it is general to first obtain and use the light intensity distribution for a certain fixed region including the object to be corrected. Incidentally, since the calculated light intensity distribution is discrete, light intensity values of necessary points are obtained by linear interpolation.

In obtaining the light intensity distribution, a Fourier-transform image of the mask pattern is first obtained and then processing called fast-Fourier-transform (FFT) is performed so as to obtain the light intensity distribution. The number of times $T_1$ of processing arithmetic in performing one-dimensional FFT is represented by the following equation.

$$T_1 = N\log_2(N)$$

Here, N is the lattice number of the points for which the light intensity distribution is obtained. For example, when N=8, $T_1$=24. The lattice number in actually obtaining the light intensity distribution is N=300 considering a range of 3 μm in increments of 0.01 μm. Here, N needs to be a power of 2 when FFT is used, the numbers such as N=256, 512, and the like are used.

On the other hand, the number of times $T_2$ of processing arithmetic in performing two-dimensional FFT is represented by the following equation.

$$T_2 = N^3\log_2(N)$$

Here, the number of calculation times $_2$ needed in obtaining the light intensity distribution of the lattice number of 256×256 is 1.3×10$^8$.

As described above, an optimal form for proximity effect correction can be derived by simulating an exposure result at every necessary time if the simulator is used but, on the other hand, there is a problem that correction processing takes long time and it is unrealistic in terms of processing time to obtain the light intensity distribution for all the regions of an enormous amount of design data.

Further, any method for performing appropriate proximity effect correction is not provided currently for a case in which the object to be corrected does not have the desired form.

SUMMARY OF THE INVENTION

The present invention has been made considering the problem described above, and its object is to provide a proximity effect correction apparatus, method, storage medium, and computer program product for correcting a proximity effect precisely and easily in an extremely short time not only when an object to be corrected coincides with a desired form (target object) but also when the object to be corrected does not have the desired form, which satisfies a demand for a further finer semiconductor element and makes it possible to manufacture a highly-reliable semiconductor device.

The inventor has thought of various forms of the invention to be described below as a result of dedicated study.

The present invention is directed to an apparatus, a method, a storage medium, and a computer program product for automatically correcting a proximity effect in exposing a mask pattern by lithography.

In the proximity effect correction method of the present invention, light intensity values only of the vicinity of a specified portion, which are necessary for correcting a proximity effect in an object to be corrected, are calculated and the object to be corrected is corrected based on the light intensity values.

In exposing the mask pattern by lithography, when the mask pattern being the object to be corrected has a desired form, the proximity effect correction method of the present invention includes a first step of judging, based on a prescribed value, a side of the object to be corrected existing near an area where the distance between in the object of the desired form is equal to or shorter than the prescribed value as a portion to be correct, a second step of calculating light intensity values only of the vicinity of the portion to be corrected, and a third step of correcting the object to be corrected based on the calculated light intensity values.

When the mask pattern being the object to be corrected does not have the desired form, the proximity effect correction method of the present invention includes a first step of judging, based on a prescribed value, a side of the object to be corrected existing near an area where the distance between edges in an object of the desired form is equal to or shorter than the prescribed value as a portion where the proximity effect is to be corrected, a second step of calculating light intensity values only on the object of the desired form in a predetermined range near the portion to be corrected, and a third step of correcting the object to be corrected based on the calculated light intensity values.

BRIEF DESCRIPTION OF THE DRAWINGS

FIG. 4 is a schematic diagram showing an example in the proximity effect correction method according to the first embodiment;

FIG. 11 is a schematic view showing the internal structure of a general personal user terminal device.

DETAILED DESCRIPTION OF THE PREFERRED EMBODIMENTS

Basic Essence of the Present Invention

The inventor of the present invention has noticed that all of obtained information on light intensity distribution is not needed in performing proximity effect correction. Therefore, the basic essence of the present invention is to, without interpolation calculation, directly calculate light intensity values only of points whose light intensity values are necessary, that is, based on a prescribed value, points existing near an area where the distance between edges in an object to be corrected is equal to or shorter than the prescribed value, without obtaining the light intensity distribution.

Here, when a spectrum immediately before FFT processing is defined as $S(n, m)$, the coordinate whose light intensity value is necessary is defined as $(x, y)$, $p_x$ is defined as the width in an x direction of a fixed region, and $p_y$ is defined as the width in a y direction thereof, a light intensity value $I(x, y)$ at the point can be obtained by the following equation.

$$I(x, y) = \Sigma_n \Sigma_m \exp[-i2\pi\{(nx/p_x)+(my/p_y)\}] \cdot S(n,m)$$

The number of calculation time $T_p$ for obtaining the light intensity value of one point is $$T_p = N^2.$$

For example, in one-dimensional processing, when the number of calculated points whose light intensity values are necessary in performing proximity effect correction is defined as $N_i$, higher-speed processing becomes possible than in a conventional method if the following equation is satisfied.

$$N_i < N \log_2(N)$$

Figure 1:
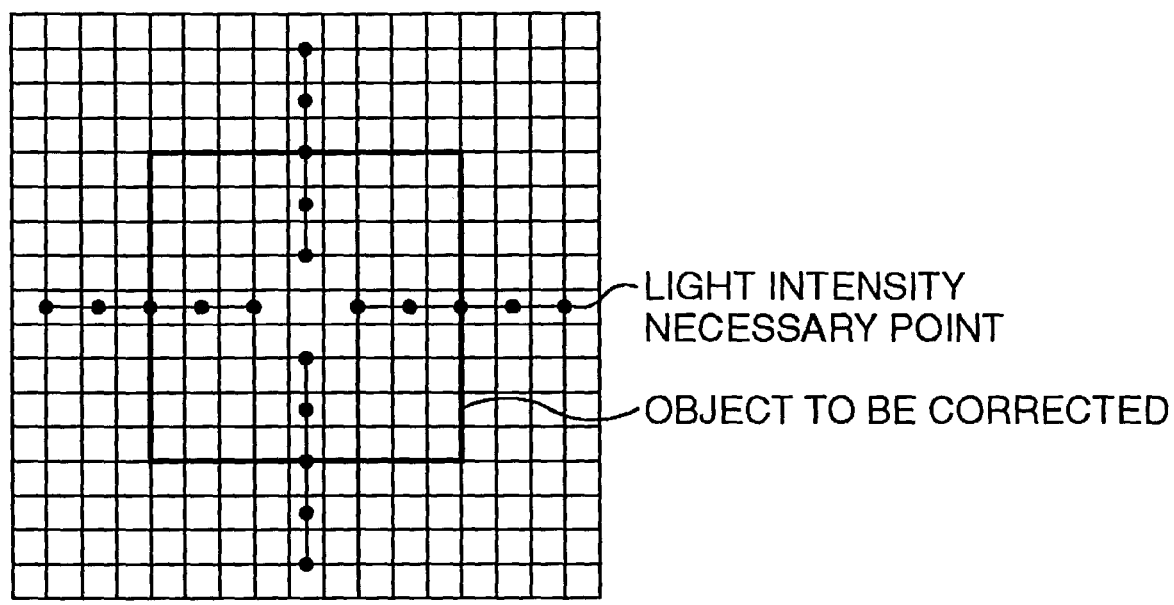
FIG. 1 is a schematic diagram for explaining the basic essence of the present invention.

For example, when an object to be corrected is a quadrangle as shown in FIG. 1, the light intensity values necessary for performing proximity effect correction are on approximately 20 points near noticed sides, which satisfies the aforesaid condition and realizes high-speed proximity effect correction processing. Further, interpolation calculation is not needed when the present invention is used, and therefore a calculation result of high accuracy can be obtained.

Specific Embodiments

Hereinafter, based on the basic essence of the present invention described above, specific embodiments to which the present invention is applied will be explained in detail with reference to the drawings.

A proximity effect correction apparatus in each embodiment below has, as a main component, a means for calculating light intensity values only of the vicinity of a specified portion, which are necessary for correcting a proximity effect in an object to be corrected, and correcting the object to be corrected based on the light intensity values.

First Embodiment

This embodiment is directed to proximity effect correction in exposing a mask pattern by lithography when an object to be corrected coincides with a desired form (target object) to be realized by exposing the mask pattern.

Figure 2:
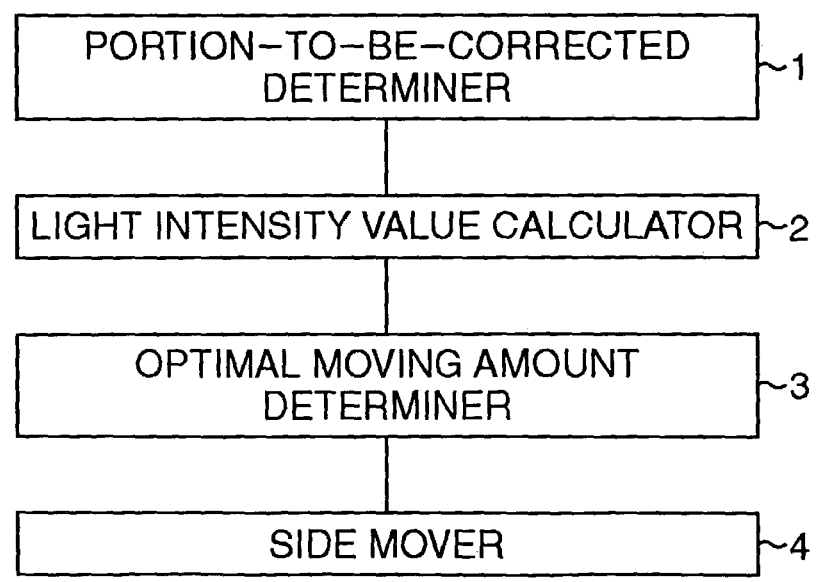
FIG. 2 is a block diagram showing the schematic structure of a proximity effect correction apparatus according to a first embodiment.

FIG. 2 is a block diagram showing the schematic structure of a proximity effect correction apparatus according to this embodiment.

The proximity effect correction apparatus is structured to have a portion-to-be-corrected determiner 1 for judging, based on a prescribed value, a side of an object to be corrected existing near an area where the distance between edges in an object of a desired form is equal to or shorter than the prescribed value as a portion where a proximity effect is to be corrected, a light intensity value calculator 2 for calculating light intensity values only on the object of the desired form in a predetermined range near the portion to be corrected, an optimal moving amount determiner 3 for determining an optimal moving amount of each side of the object to be corrected by the calculated light intensity values, and a side mover 4 for correcting the object to be corrected based on the optimal moving amounts.

Figure 3:
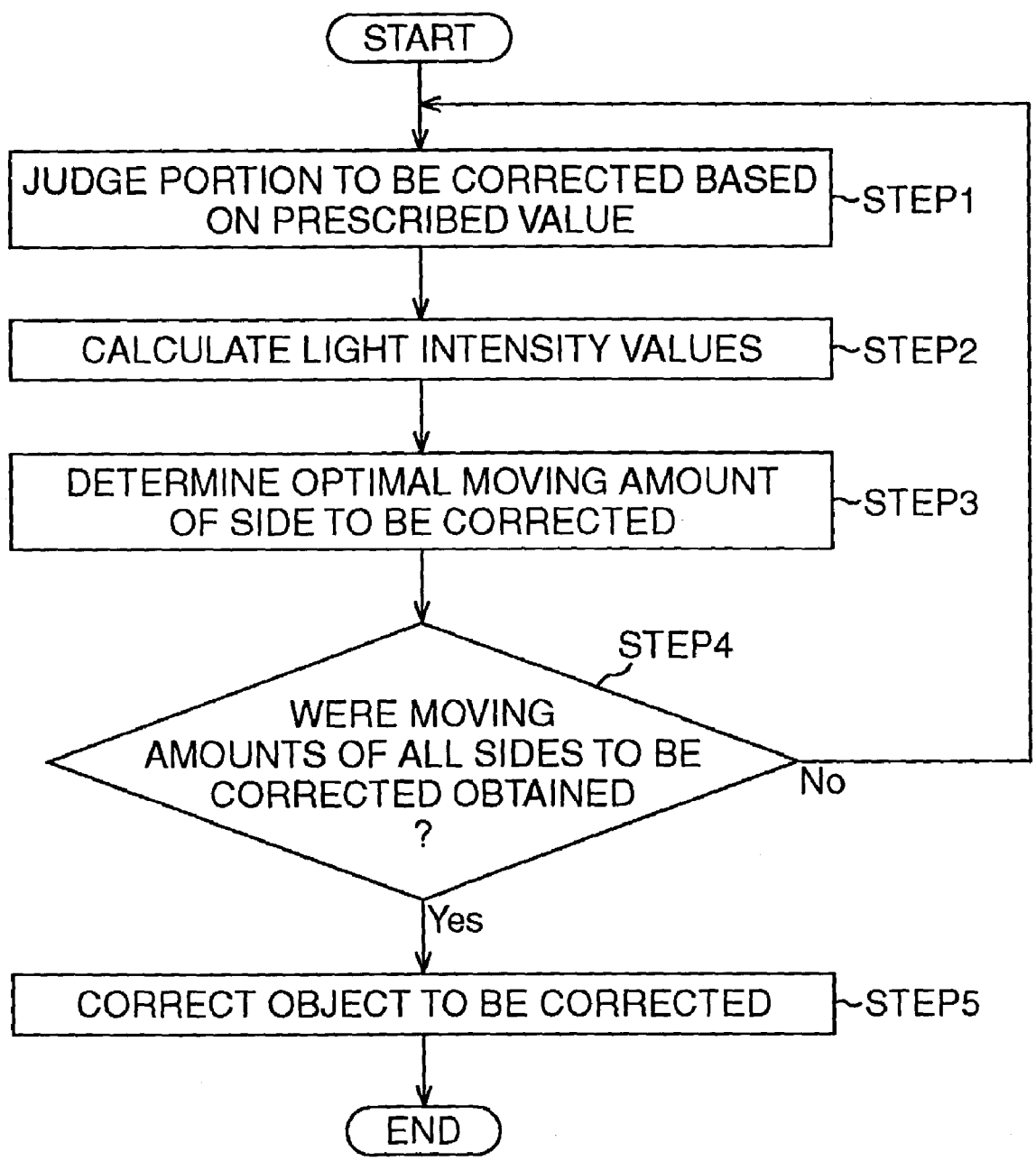
FIG. 3 is a flow chart showing a proximity effect correction method according to the first embodiment in the order of steps.

FIG. 3 is a flow chart showing a proximity effect correction method according to this embodiment in the order of steps.

For example, when proximity effect correction is performed to an object to be corrected as shown in FIG. 4, based on a prescribed value, an area where the distance between edges of the object to be corrected is equal to or shorter than the prescribed value is first judged as a portion where a proximity effect is to be corrected (step 1). Correction areas 11 to 16 are portions to be corrected in the drawing. Here, as the prescribed value, for example, 0.2 µm is applied when the exposure wave length is 0.248 µm and 0.18 µm is applied when the exposure wave length is 0.193 µm.

Subsequently, light intensity values $I(x, y)$ at light intensity value calculation points are calculated by the aforesaid method for each of the portions 11 to 16 to be corrected (step 2).

Figure 5A:
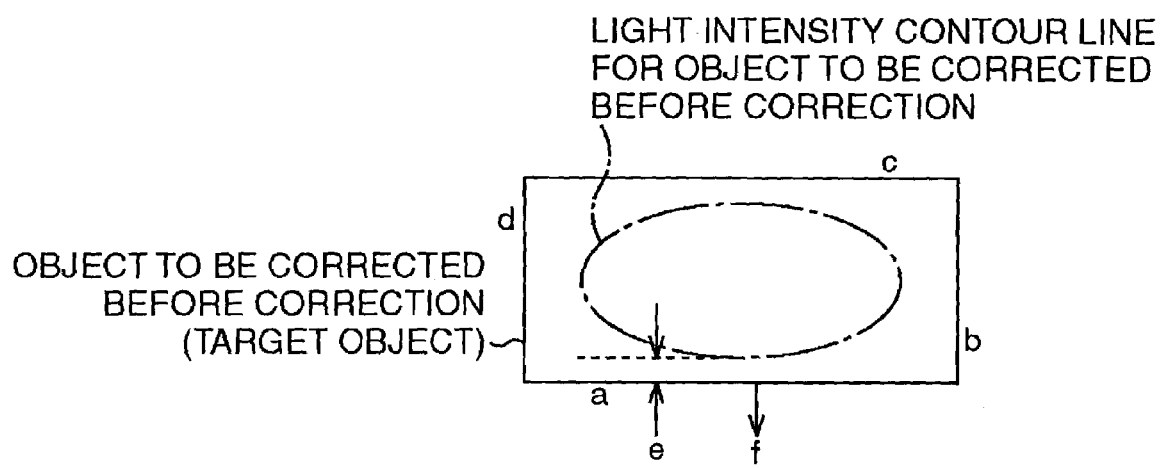
FIGS. 5A and 5B are schematic diagram showing an example in the proximity effect correction method according to the first embodiment.

Next, optimal moving amounts of sides 17 to 28 to be corrected are determined from a position of a light intensity contour line obtained by the calculated light intensity value (step 3). Here, an example when an object to be corrected (target object) is a quadrangle consisting of sides a, b, c, and d as shown in FIG. 5A will be explained for convenience. When the side a is to be corrected, an optimal moving amount f of the side is determined after calculating a separation amount e between the target object and the light intensity contour line. The same operation is also performed to the sides b, c, and d so that optimal moving amounts of all the sides are determined.

Figure 5B:
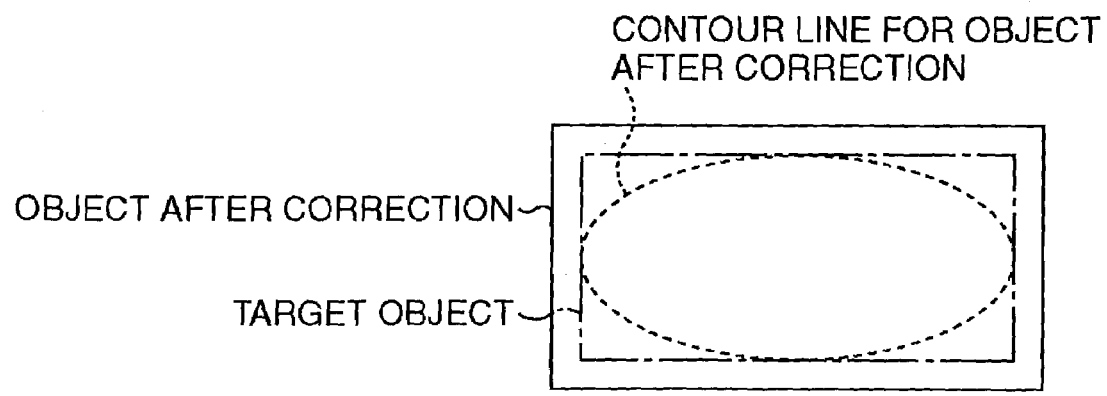

Then, after the optimal moving amounts are obtained for all the sides to be corrected (step 4), the sides to be corrected are moved based on the optimal moving amounts so that the object to be corrected is corrected (step 5). One example after the proximity effect correction is shown in FIG. 5B.

The total processing time is 0.1 second for obtaining light intensity values of 30 points near sides requiring proximity effect correction in a region of 5 μm×4 μm in FIG. 4 by the proximity effect correction method of this embodiment. When the light intensity distribution is calculated by the conventional method for the same region, it is found out that the total processing time is 0.5 second and that extremely high-speed correction processing is realized by the proximity effect correction method of this embodiment.

As explained above, according to this embodiment, when the mask pattern being the object to be corrected has the desired form, it is possible to correct the proximity effect precisely and easily in an extremely short time and to manufacture a highly reliable semiconductor device while satisfying a demand for a further finer semiconductor element.

Second Embodiment

This embodiment is directed to proximity effect correction in performing exposure of a mask pattern by lithography when an object to be corrected does not have a desired form (target object) to be realized by exposing the mask pattern.

Figure 6:
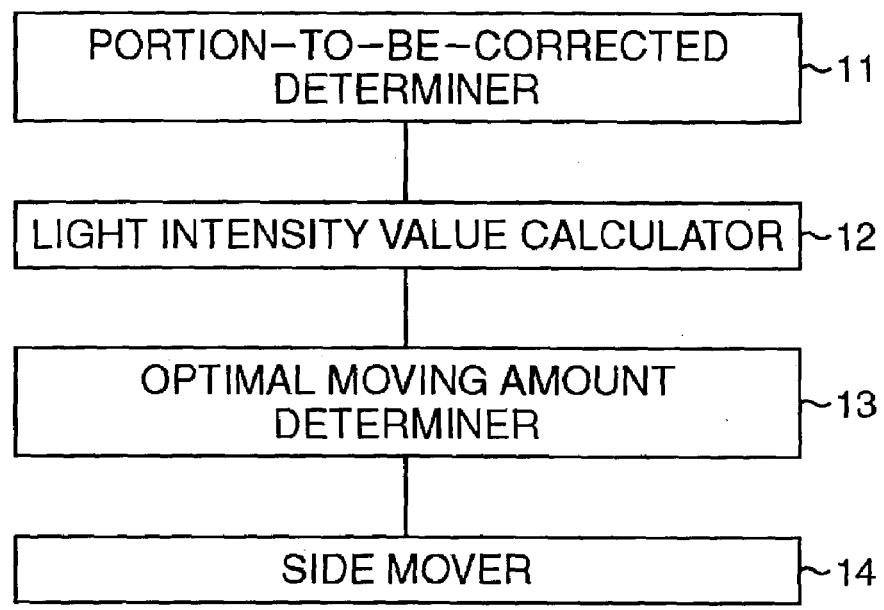
FIG. 6 is a block diagram showing the schematic structure of a proximity effect correction apparatus according to a second embodiment.

FIG. 6 is a block diagram showing the schematic structure of a proximity effect correction apparatus according to this embodiment.

The proximity effect correction apparatus is structured to have a portion-to-be-corrected determiner 11 for judging, based on a prescribed value, a side of an object to be corrected existing near an area where the distance between edges in an object of a desired form is equal to or shorter than the prescribed value as a portion where a proximity effect is to be corrected, a light intensity value calculator 12 for calculating light intensity values only on the object of the desired form in a predetermined range near the portion to be corrected, an optimal moving amount determiner 13 for determining an optimal moving amount of each side of the object to be corrected by the calculated light intensity values, and a side mover 14 for moving each side based on the optimal moving amount to correct the object to be corrected.

Figure 7:
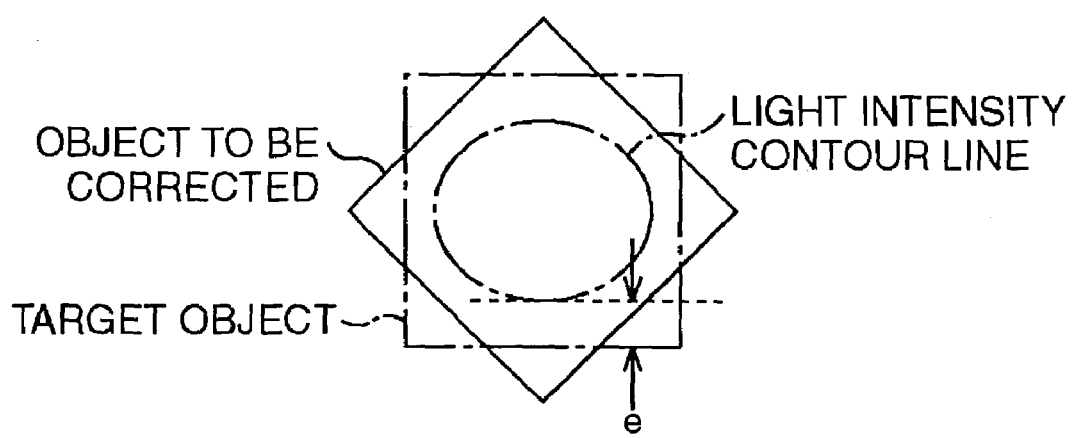
FIG. 7 is a schematic diagram for explaining inconvenience when an object to be corrected is different from a target object.

When the object to be corrected is different from the target object as in this example, the separation amount e and the moving amount of the side cannot be corresponded to each other, as shown in FIG. 7, by the method of calculating the separation amount between the light intensity contour line and the side as in the first embodiment.

Thus, in this embodiment, proximity effect correction is performed in the following manner without using the light intensity contour line.

Figure 8:
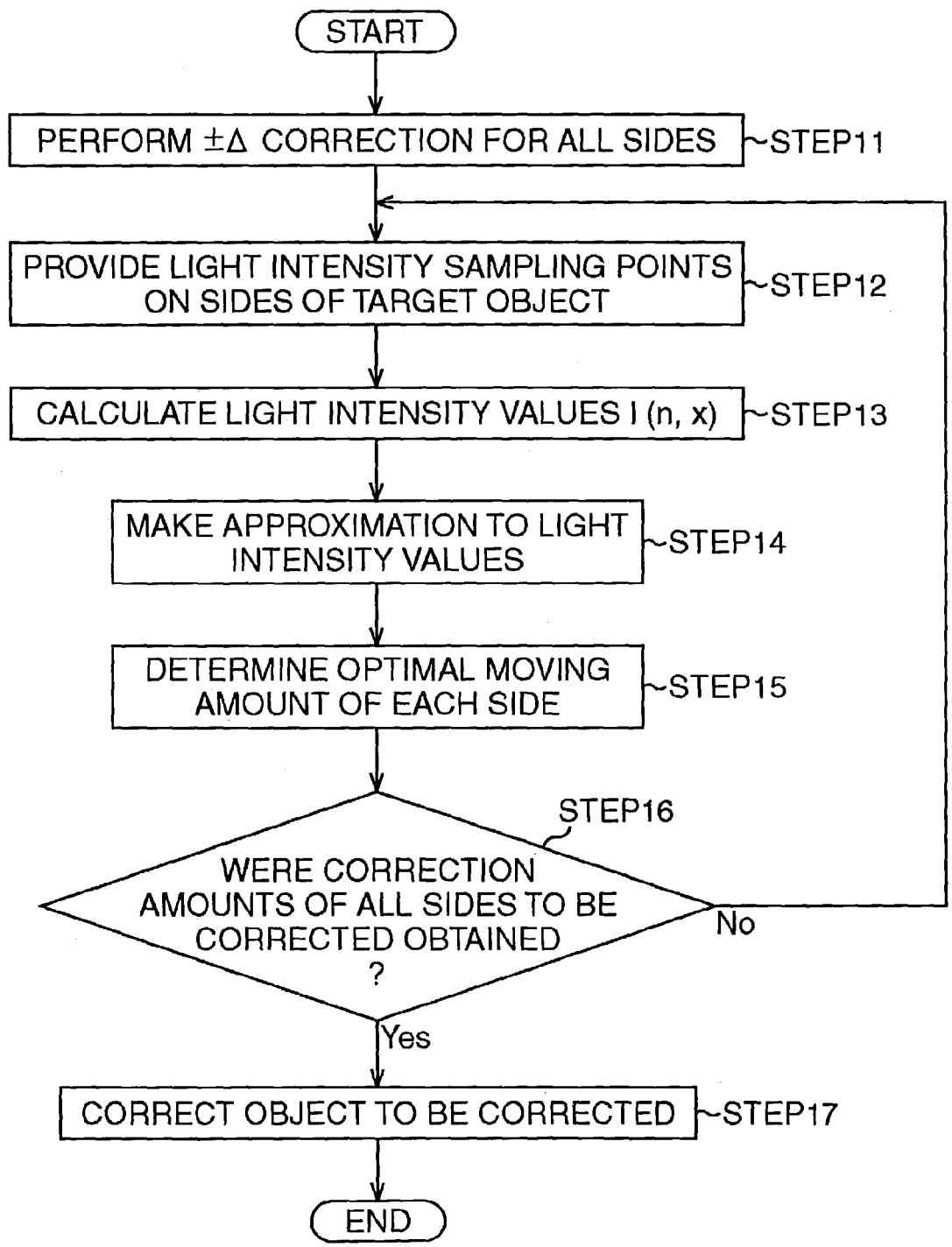
FIG. 8 is a flow chart showing a proximity effect correction method according to the second embodiment in the order of steps.

FIG. 8 is a flow chart showing a proximity effect correction method according to this embodiment in the order of steps.

Figure 9:
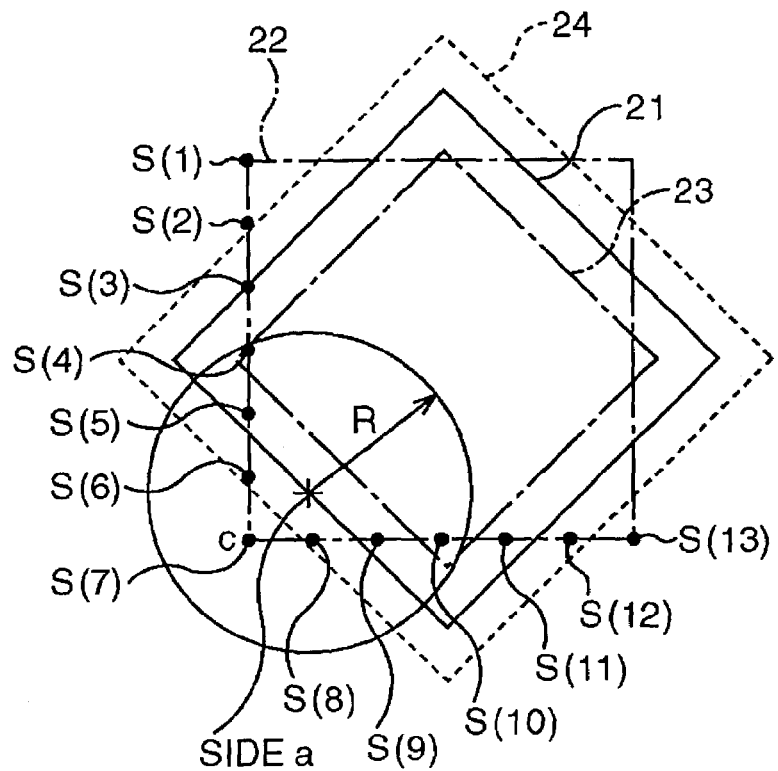
FIG. 9 is a schematic diagram showing an example in the proximity effect correction method according to the second embodiment.

For example, when proximity effect correction is performed in a case in which an object 21 to be corrected and a target object 22 are different as shown in FIG. 9, two kinds of objects to be corrected (an object 23 after correction: a case in which correction of $-\Delta$ is performed to all the sides, and an object 24 after correction: a case in which correction of $+\Delta$ is performed to all the sides) are first previously generated on trial (step 11).

Subsequently, an optimal moving amount of each side is calculated. Here, a side a will be explained as an example.

Sampling points s(n) of light intensity are set on sides of the target object 22 near the side a (step 12). Here, n is 1 to 13. The samplings are determined so that the interval between the sampling points is equal to or shorter than a desired value. For example, when the length of a side is 0.1 μm and the sampling interval is to be equal to or shorter than 0.03 μm, at least four samplings are needed on the side. If importance is to be attached to a light intensity value at the center of the side, the number of the samplings on the side is 5. Incidentally, from experiences, it is found that the preferable sampling interval is approximately $0.1 \times \lambda/NA$ and the use of odd numbers of samplings on one side leads to a good effect. Here, $\lambda$ indicates the exposure wave length and NA indicates the number of openings.

Subsequently, only the sampling points whose distance from the center of the side a is within R, that is, S(4) to S(10) are left, and their light intensity values I (n, x) when three kinds of masks (the object 23 after correction, the object 21 to be corrected, and the object 24 after correction) are calculated and stored (step 13). Here, n indicates the sample number and x indicates the moving amount of the side. Further, from experiences, $0.1 \times \lambda/NA$ to $0.3 \times \lambda/NA$ is preferably used as R. In this example, 21 light intensity values are calculated.

Then, approximation is made to a light intensity value for any moving amount by the following equation using the light intensity values I(n, x) calculated in step 13 (step 14). Here, n is supposed to be 4 to 10.

$$I(n, x) = A(n) \cdot x + B(n) \cdot x^2 + C(n)$$

In this case, since the light intensity values for three moving amounts $(0, -\Delta, +\Delta)$ are obtained at one sampling point, approximation is possible by the quadratic equation described above.

Subsequently, using an error amount E in place of the separation amount e between the light intensity contour line and the side, an optimal moving amount x of a side, which minimizes E, is obtained (step 15). This presents the best side moving amount when the problem is to be solved by moving the side.

$$E = \Sigma^{10}_{n=4} W(n) \{I(n, x) - t\}^2$$

Here, t indicates a target light intensity value, which is equal to the value of the light intensity contour line for calculating the separation amount. W(n) indicates a weight coefficient which the sampling point has, and is defined by the following equation.

$$W(n) = 1 - r/R$$

Here, r indicates an absolute value of the distance from the center of the side to the sampling point.

Incidentally, this equation for defining the weight coefficient is not fixed, and needs to be changed depending on a pattern form to be corrected. For example, the following equations are also possible.

$$W(n)=2-r/R$$

$$W(n)=1-(r/R)^2$$

In a state in which mutual interference between the sides is strong, a good result is obtained by giving a larger weight value to a distant sampling point while, when little mutual dependence exists on the contrary, it is recommended to give a large value to a close sampling point. Incidentally, it is found that, if a form of the function for determining the weight coefficient is made to be constantly reduced between $0<r<R$, less minute protrusions occur in an object form after correction.

Further, if a smaller weight coefficient is given to a point closer to a corner part, excessive correction in the corner part can be prevented. The weight coefficient in this case is as follows.

$$W(n)=(1-r/R)W_C$$

$$W_C=1; \; d>0.05$$

$$W_C=0; \; d\leq 0.05$$

Here, d indicates an absolute value of the distance from a corner part C to a sampling point.

Figure 10:
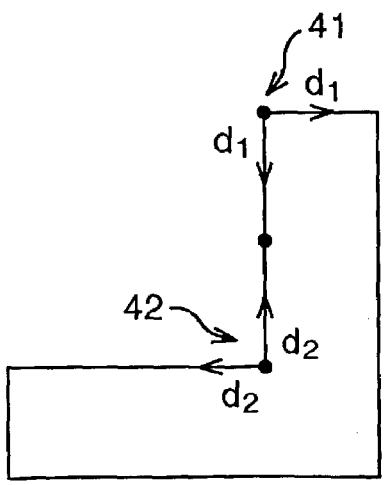
FIG. 10 is a schematic diagram showing a state of the vicinity of concave and convex portions in performing proximity effect correction by giving different weights to corners of the concave and convex portions in the second embodiment.

Further, as shown in FIG. 10, when different weights are given to a corner of a convex part 41 and a corner of a concave part 42, equations are as follows.

$$W(n)=(1-r/R)\cdot W_{C1}\cdot W_{C2}$$

$$W_{C1}=1; \; d_1\geq 0.05$$

$$W_{C1}=d_1/0.05; \; d_1<0.05$$

$$W_{C2}=1; \; d_2\geq 0.03$$

$$W_{C1}=d_1/0.03; \; d_2<0.03$$

Here, $d_1$ indicates an absolute value of the distance from the corner of the concave part 41 to a sampling point, and $d_2$ indicates an absolute value of the distance from the corner of the concave part 42 to the sampling point.

Then, after optimal moving amounts for all the sides to be corrected are obtained (step 16), each side of the object 21 to be corrected is moved based on the optimal moving amount so as to correct the object to be corrected (step 17).

As explained above, according to this embodiment, even when the object to be corrected does not have the desired form (target object), it is possible to correct the proximity effect precisely and easily in an extremely short time and to manufacture a highly reliable semiconductor device while satisfying a demand for a further finer semiconductor element.

It should be noted that each function composing the proximity effect correction apparatus and each step (steps 1 to 5 and steps 11 to 17) in the proximity effect correction method according to the first and second embodiments described above can be realized by the operation of a computer program product stored in a RAM, a ROM, and the like of a computer. The computer program product and a computer readable storage medium which records the computer program product are included in the embodiments of the present invention.

Specifically, the computer program product is provided to the computer by being recorded in a recording medium such as, for example, a CD-ROM or via various transmission media. As the recording medium for recording the computer program product, a flexible disk, a hard disk, a magnetic tape, a magneto-optical disk, a non-volatile memory card, and the like can be used other than the CD-ROM. On the other hand, as the transmission medium for the computer program product, it is possible to use a communication medium (a cable channel such as an optical fiber, a wireless channel, and the like) in a computer network (LAN, WAN such as the Internet, a wireless communication network, and the like) system for propagating and supplying computer program product information as a carrier wave.

The computer program product comprises a first computer readable program code means for judging, based on a prescribed value, a side of the object to be corrected existing near an area where the distance between the edges in the object of the desired form is equal to or shorter than the prescribed value as a portion to be corrected; a second computer readable program code means for calculating light intensity values of the vicinity of the portion to be corrected; and a third computer readable program codes means for correcting the object to be corrected based on the calculated light intensity.

Further, such a computer program product is included in the embodiments of the present invention not only when the functions in the above embodiments are realized as a result of executing the supplied computer program product by the computer, but also when the functions in the above embodiments are realized in collaboration with an OS (operating system) run by the computer program product in the computer or other application software and the like, and when the functions in the above embodiments are realized by the fact that all or a part of processing of the supplied computer program product is performed by a function expansion board or a function expansion unit of the computer.

For example, FIG. 11 is a schematic diagram showing the internal structure of a general personal user terminal device. In FIG. 11, 1200 is a computer PC. The PC 1200 has a CPU 1201, and executes device control software stored in a ROM 1202 or a hard disk (HD) 1211 or supplied from a flexible disk drive (FD) 1212 so as to totally control each device connected to a system bus 1204.

According to the present invention, not only when an object to be corrected coincides with a desired form (target object) but also when the object to be corrected does not have the desired form, it is possible to correct a proximity effect precisely and easily in an extremely short time and to manufacture a highly-reliable semiconductor device while satisfying a demand for a further finer semiconductor element.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A proximity effect correction method for correcting a mask design object to correct a proximity effect of a mask pattern to be formed on a substrate by lithography, comprising the steps of:

judging, based on a determination that a distance between object sides of mask design objects is equal to or shorter than a prescribed distance, the mask design object as a portion to be corrected;

calculating light intensity values at the portion to be corrected within a range prescribed in accordance with a resolution limit of the lithography; and calculating a moving amount of the object side of the mask design object based on the light intensity values.

2. The proximity effect correction method according to claim 1, wherein the range of the light intensity values to be calculated is within a radius represented by the following equation:

$$\kappa \cdot \lambda / N_A,$$

where $\kappa$ indicates a real number from 0.1 to 0.3, $\lambda$ indicates exposure wave length, and $N_A$ indicates the number of openings.

3. The proximity effect correction method according to claim 1, wherein the moving amount is calculated to minimize a distance between a light intensity contour line obtained by the calculated light intensity values and a pattern side of a target mask pattern.

4. The proximity effect correction method according to claim 1, wherein the moving amount is calculated to minimize an error in light intensity calculated from the light intensity values and a light intensity value of a target mask pattern.

5. A proximity effect correction apparatus for correcting a mask design object to correct a proximity effect of a mask pattern to be formed on a substrate by lithography, comprising:

a determiner for judging, based on a determination that a distance between object sides of mask design objects is equal to or shorter than a prescribed distance, the mask design object as a portion to be corrected;

a calculator for calculating light intensity values at the portion to be corrected within a range prescribed in accordance with a resolution limit of the lithography; and a calculator for calculating a moving amount of the object side based on the light intensity values.

6. The proximity effect correction apparatus according to claim 5, wherein the range of the light intensity values to be calculated is within a radius represented by the following equation:

$$\kappa \cdot \lambda / N_A,$$

where $\kappa$ indicates a real number from 0.1 to 0.3, $\lambda$ indicates exposure wave length, and $N_A$ indicates the number of openings.

7. The proximity effect correction apparatus according to claim 5, wherein the moving amount is calculated to minimize a distance between a light intensity contour line obtained by the calculated light intensity values and a pattern side of a target mask pattern.

8. The proximity effect correction apparatus according to claim 5, wherein the moving amount is calculated to minimize an error in light intensity calculated from the light intensity values and a light intensity value of a target mask pattern.

9. A computer readable storage medium for use in a computer, the computer readable storage medium encoded with a computer program product for correcting a mask design object by correcting a proximity effect of a mask pattern to be formed on a substrate by lithography, the computer program causing the computer to execute a method comprising:

judging, based on a determination that a distance between object sides of mask design objects is equal to or shorter than a prescribed distance, the mask design object as a portion to be corrected;

calculating light intensity values at the portion to be corrected within a range prescribed in accordance with a resolution limit of the lithography; and calculating a moving amount of the object side of the mask design object based on the light intensity values.

10. The computer readable storage medium according to claim 9, wherein the range of the light intensity values to be calculated is within a radius represented by the following equation:

$$\kappa \cdot \lambda / N_A,$$

where $\kappa$ indicates a real number from 0.1 to 0.3, $\lambda$ indicates exposure wave length, and $N_A$ indicates the number of openings.

11. The computer readable storage medium according to claim 9, wherein the moving amount is calculated to minimize a distance between a light intensity contour line obtained by the calculated light intensity values and a pattern side of a target mask pattern.

12. The computer readable storage medium according to claim 9, wherein the moving amount is calculated to minimize an error in light intensity calculated from the light intensity values and a light intensity value of a target mask pattern.

13. A computer program product comprising a computer usable medium having computer readable program code means embodied in said medium for correcting a proximity effect of a mask pattern to be formed on a substrate by lithography, said computer readable program code means comprising:

a first computer readable program code means for judging, based on a determination that a distance between object sides of mask design objects is equal to or shorter than a prescribed distance, the mask design object as a portion to be corrected;

a second computer readable program code means for calculating light intensity values at the portion to be corrected within a range prescribed in accordance with a resolution limit of the lithography; and a third computer readable program code means for calculating a moving amount of the object side of the mask design object based on the light intensity values.

14. The computer program product according to claim 13, wherein the range of the light intensity values to be calculated is within a radius represented by the following equation:

$$\kappa \cdot \lambda / N_A,$$

where $\kappa$ indicates a real number from 0.1 to 0.3, $\lambda$ indicates exposure wave length, and $N_A$ indicates the number of openings.

15. The computer program product according to claim 13, wherein said third computer readable program code means calculates the moving amount to minimize a distance between a light intensity contour line obtained by the calculated light intensity values and a pattern side of a target mask pattern.

16. The computer program product according to claim 13, wherein said third computer readable program code means calculates the moving amount to minimize an error in light intensity calculated from the light intensity values and a light intensity value of a target mask pattern.

* * * * *